(12) United States Patent
Chuang et al.

(10) Patent No.: US 10,091,892 B2
(45) Date of Patent: Oct. 2, 2018

(54) LASER DIRECT IMAGING SYSTEM AND METHOD FOR SOLDER MASK EXPOSURE

(71) Applicant: SHUZ TUNG MACHINERY INDUSTRIAL CO., LTD., Taichung (TW)

(72) Inventors: Chun-Chih Chuang, Taichung (TW); Yung-Peng Hu, Taichung (TW)

(73) Assignee: SHUZ TUNG MACHINERY INDUSTRIAL CO., LTD., Taichung (TW)

( * ) Notice: Subject to any disclaimer, the term of this patent is extended or adjusted under 35 U.S.C. 154(b) by 0 days.

(21) Appl. No.: 15/230,864

(22) Filed: Aug. 8, 2016

(65) Prior Publication Data

US 2017/0068167 A1 Mar. 9, 2017

(30) Foreign Application Priority Data

Sep. 3, 2015 (TW) .............................. 104129236 A

(51) Int. Cl.
*G03B 27/52* (2006.01)
*G03B 27/54* (2006.01)
*H05K 3/34* (2006.01)
*G03F 7/20* (2006.01)
*H05K 3/00* (2006.01)

(52) U.S. Cl.
CPC ....... *H05K 3/3452* (2013.01); *G03F 7/70858* (2013.01); *G03F 7/70933* (2013.01); *H05K 3/0023* (2013.01); *H05K 3/0026* (2013.01); *H05K 2203/107* (2013.01)

(58) Field of Classification Search
CPC .... G03F 7/2004; G03F 7/2051; G03F 7/2053; G03F 7/70841; G03F 7/70858; G03F 7/70933; H05K 3/0023; H05K 3/0026; H05K 3/3452; H05K 2203/107
USPC ..................................................... 355/30, 67
See application file for complete search history.

(56) References Cited

U.S. PATENT DOCUMENTS

2002/0018190 A1* 2/2002 Nogawa .............. G03F 7/70525
355/30
2006/0065640 A1* 3/2006 Lizotte ............... B23K 26/0604
219/121.61

\* cited by examiner

*Primary Examiner* — Colin Kreutzer
(74) *Attorney, Agent, or Firm* — Muncy, Geissler, Olds & Lowe, P.C.

(57) ABSTRACT

A laser direct imaging system includes a stage, a laser device and an oxygen-reducing device. The stage is subjected to an atmospheric pressure. The laser device is configured to provide a laser beam to scan across the substrate. The oxygen-reducing device operates simultaneously with the laser device for outputting an inert gas only to a specific area where the laser beam is being aimed such that any portion of the substrate, if enters the specific area, will be exposed to the laser beam under a low-oxygen environment.

6 Claims, 12 Drawing Sheets

LASER DIRECT IMAGING SYSTEM AND METHOD FOR SOLDER MASK EXPOSURE

BACKGROUND OF THE INVENTION

1. Field of the Invention

The present invention relates to a laser direct imaging system and method, and more particularly to a laser direct imaging system and method for PCB solder mask exposure.

2. Description of the Related Art

Typically, a solder mask or solder resist is applied to the copper traces of a printed circuit board (PCB) for protection against oxidation and to prevent solder bridges from forming between closely spaced solder pads. Once applied, openings must be made in the solder mask wherever components are soldered, which is accomplished using photolithography.

FIGS. 13-15 depicts a conventional process for forming a patterned solder mask on a PCB. In FIG. 13, there is shown a PCB 9 with copper pads 90 thereon. Next, in FIG. 14, a solder mask material 91 (such as a Liquid PhotoImageable Solder Mask, LPISM) is applied onto the PCB 9, dried in an oven to remove the solvent of the material, and then exposed to a UV light source by using photolithography that removes the un-exposed material, leaving behind the patterned solder mask 91' as well as the exposed copper pads 90, as shown in FIG. 15. Finally, the solder mask 91' will be subjected to a thermal process to be completely cured.

As described above, the finished solder mask 91' has an appearance with high gloss. This results from the UV light source that is typically a high-pressure mercury-vapor lamp (Hg bulbs) and is constructed to emit primarily the ultraviolet radiation within a wavelength range of 320 nm to 410 nm according to the solder mask material.

Other than the photolithography process using the Hg bulbs, a Laser Direct Imaging (LDI) method may also be used for exposure of the solder mask material. In LDI of printed circuit boards, a laser is used to image a pattern directly onto a substrate, completely eliminating the production and use of a traditional photo tool. The most obvious benefits of LDI are the time and costs savings associated with the creation, use, handling and storage of photo tools. However, when using a laser as light source for exposure instead of the usually used Hg bulbs, the exposure wavelength of the laser cannot be completely matched to the spectral sensitivity of the solder mask material designed for the Hg bulbs. The spectral sensitivity of the solder mask material does not abruptly end at a certain wavelength, but smoothly drops to zero over few 10 nm. Thus, as compared to the solder mask formed using the Hg bulbs, the solder mask using the UV laser of a single wavelength, such as 405 nm, has extremely low gloss, which is unacceptable by the consumers. For this manufacturers and PCB fabricators have developed products that offer exposure sensitivity suitable for laser direct imaging.

SUMMARY OF THE INVENTION

Accordingly, the present invention provides a laser direct imaging system to solve the aforementioned problem. That is, with the conventional solder mask material, especially LPISM, the laser direct imaging system can still give a gloss to a solder mask that can almost be up to the standard of a conventional solder mask made by the photolithography using the Hg bulbs.

Briefly described, the laser direct imaging system of this invention includes a stage, a laser device and an oxygen-reducing device. The stage is subjected to an atmospheric pressure. The laser device is configured to provide at least one laser beam to scan across a surface of the substrate located on the stage. The oxygen-reducing device operates simultaneously with the laser device for outputting an inert gas only to a specific area where the laser beam is being aimed such that any portion of the substrate, if enters the specific area, can be exposed to the laser beam under a low-oxygen environment.

In one embodiment, the oxygen-reducing device includes a gas supply system and a chamber. The gas supply system is provided to supply the insert gas. The chamber has an inlet connected to the gas supply system for entrance of the insert gas into the chamber, and an outlet facing the substrate to allow the insert gas to flow across the surface of the substrate to create the low-oxygen environment above the substrate. The laser beam of the laser device is passed through the outlet of the chamber to the surface of the substrate. In one example, the chamber is cylindrical in shape, and the chamber and the laser beam share a common axis.

In another embodiment, the laser device is a linear laser module which produces a linear laser beam. And, the oxygen-reducing device includes a gas supply system and a chamber. The gas supply system is provided for supplying the insert gas. The chamber has an inlet connected to the gas supply system for entrance of the insert gas into the chamber, and an outlet facing the substrate to allow the insert gas to flow across the surface of the substrate to create the low-oxygen environment above the substrate.

More specifically, the linear laser device includes a plurality of laser diodes arranged in a line to together produce the linear laser beam. The oxygen-reducing device further includes a flow guiding plate disposed in the outlet of the chamber. Moreover, the flow guiding plate defines a plurality of holes corresponding to the laser diodes in such a way that a laser beam emitted by each of the laser diodes is passed through the respective hole of the flow guiding plate to the substrate.

Preferably, the oxygen-reducing device further includes a frame pressing against edges of the flow guiding plate to secure the flow guiding plate around the outlet of the chamber.

In yet another embodiment, the laser device includes a plurality of laser diodes arranged in a line to together produce the linear laser beam. And the oxygen-reducing device further includes a gas supply system, a chamber, a frame, a flow guiding plate and a transparent sheet. The gas supply system has a pipeline to transport the insert gas. The chamber has an inlet and an outlet, wherein the outlet is defined in a bottom of the chamber and faces the surface of the substrate, and the laser device is located on top of the chamber. The frame is disposed around the outlet of the chamber and defines an aperture therein. The flow guiding plate is disposed in the outlet of the chamber and defines a plurality of holes corresponding to the laser diodes in such a way that a laser beam emitted by each of the laser diodes is passed through the respective hole of the flow guiding plate to the substrate. The transparent sheet is disposed on top of the frame. And, the transparent sheet, the frame and the flow guiding plate together define an inner room within the chamber, and the laser beams generated by the laser diodes are passed through the transparent sheet into the inner room and exit via the holes of the flow guiding plate to the substrate. Besides, the pipeline of the gas supply system passes through the inlet of the chamber and the aperture of the frame to introduce the inert gas into the inner room.

The present invention further provides a laser direct imaging method, comprising the steps of: (a). placing a substrate on a stage under an atmospheric-pressure condition, wherein the substrate is coated with a liquid photoimageable solder mask; (b). scanning across the surface of the substrate with a laser device at a wavelength in a range of 350 nm to 410 nm; and (c). while the substrate is being scanned, continuously introducing an inert gas only to a specific area where a laser beam of the laser device is being aimed such that any portion of the substrate, if enters the specific area, can be exposed to the laser beam under a low-oxygen environment.

The foregoing and other objectives, features, and advantages of the invention will be more readily understood upon consideration of the following detailed description of the invention, taken in conjunction with the accompanying drawings.

DETAILED DESCRIPTION OF EMBODIMENTS

Figure 1:
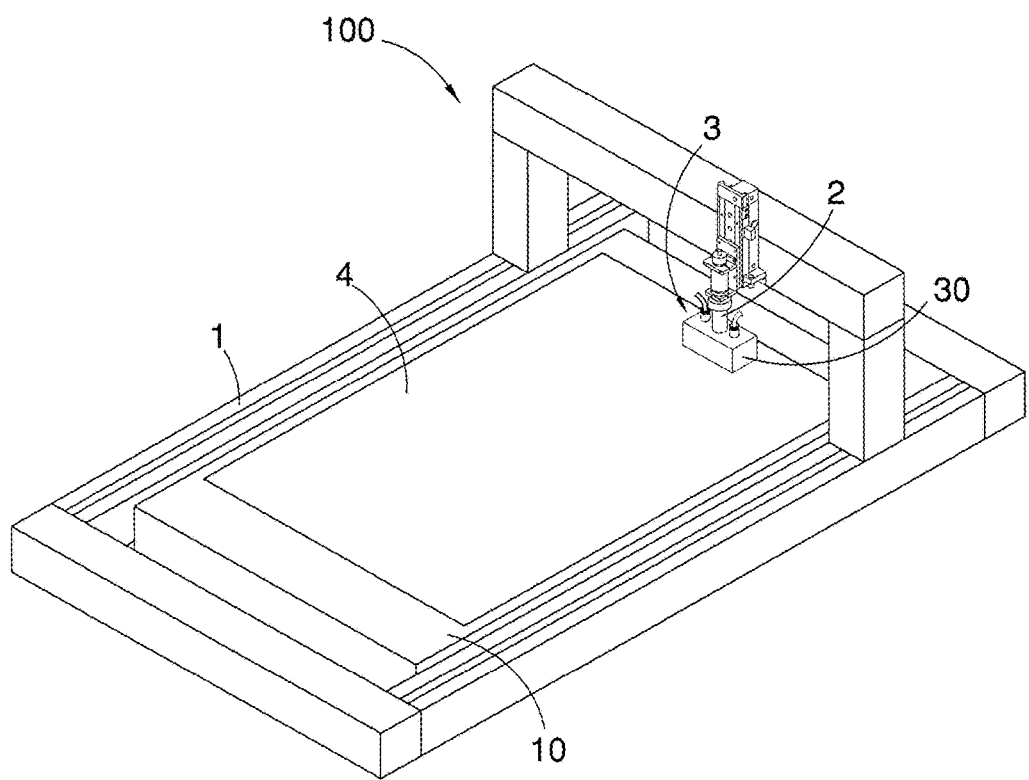
FIG. 1 is a perspective view of a laser direct imaging system in accordance with a first embodiment of the present invention.

Referring to FIG. 1, there is shown a laser direct imaging system 100 according to a first embodiment of this invention. The laser direct imaging system 100 generally includes a machine 1, a laser device 2 and an oxygen-reducing device 3. The machine 1 has a stage 10 that is subjected to an atmospheric pressure. A substrate 4 coated with a solder mask material is placed on the stage 10 to for laser direct imaging.

Figure 2:
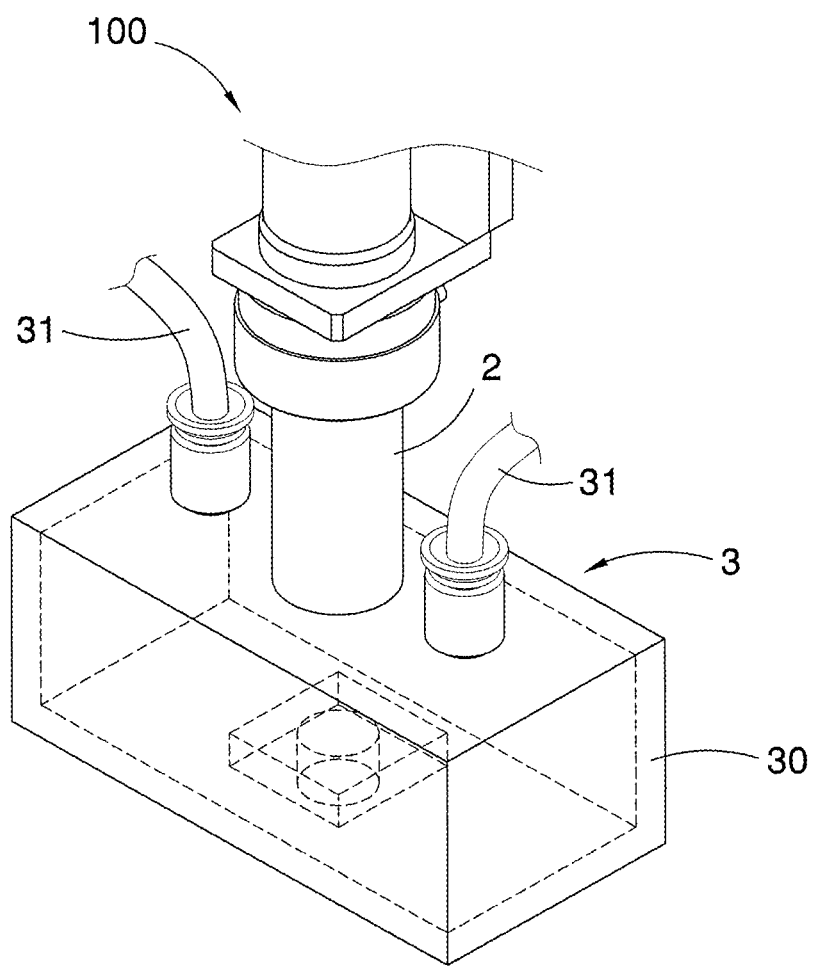
FIG. 2 is a partial enlarged perspective view of the laser direct imaging system shown in FIG. 1, showing a laser device and an oxygen-reducing device.

As shown in FIGS. 1 and 2, the laser device 2, such as a laser diode, is disposed in the machine 1 and configured to provide a laser beam 21 (FIG. 3) at a wavelength in the range of 350 nm to 410 nm for scanning across a surface of the substrate 4 located on the stage 10. The oxygen-reducing device 3, which operates simultaneously with the laser device 2 for outputting an inert gas, such as nitrogen gas, only to a specific area where the laser beam 21 is being aimed such that any portion of the substrate 4, if enters the specific area, will be exposed to the laser beam 21 under a low-oxygen environment.

In this embodiment, the substrate 4 is a printed circuit board coated with a solder mask material, such as a liquid photoimageable solder mask. Typically, the solder mask material is composed of a photoinitiator, oligomers, reactive monomers and other additives. Basically light absorbed by the photoinitiator generates free-radical type initiators or catalysts which induce the crosslinking reactions of functionalized oligomers/monomers to generate a cured film. However, using this photoinitiated radical polymerization, there is a challenge of free radical photocuring inhibition by the presence of oxygen. This oxygen inhibition is due to the rapid reaction of carbon centered propagating radicals with oxygen molecules to yield peroxyl radicals. These peroxyl radicals are not as reactive towards carbon-carbon unsaturated double bonds and therefore do not initiate or participate in any photopolymerization reaction. Oxygen inhibition usually leads to premature chain termination that results in incomplete photocuring. For this, the present invention is intended to avoid this problem and is carried out in inert environments (for example, under nitrogen or argon), to reduce the oxygen inhibition. And more particularly, a low-oxygen environment is intentionally created only to a specific area where a laser beam of the laser device is being aimed such that any portion of the substrate, if enters the specific area, will be exposed to the laser beam under the low-oxygen environment.

Figure 3:
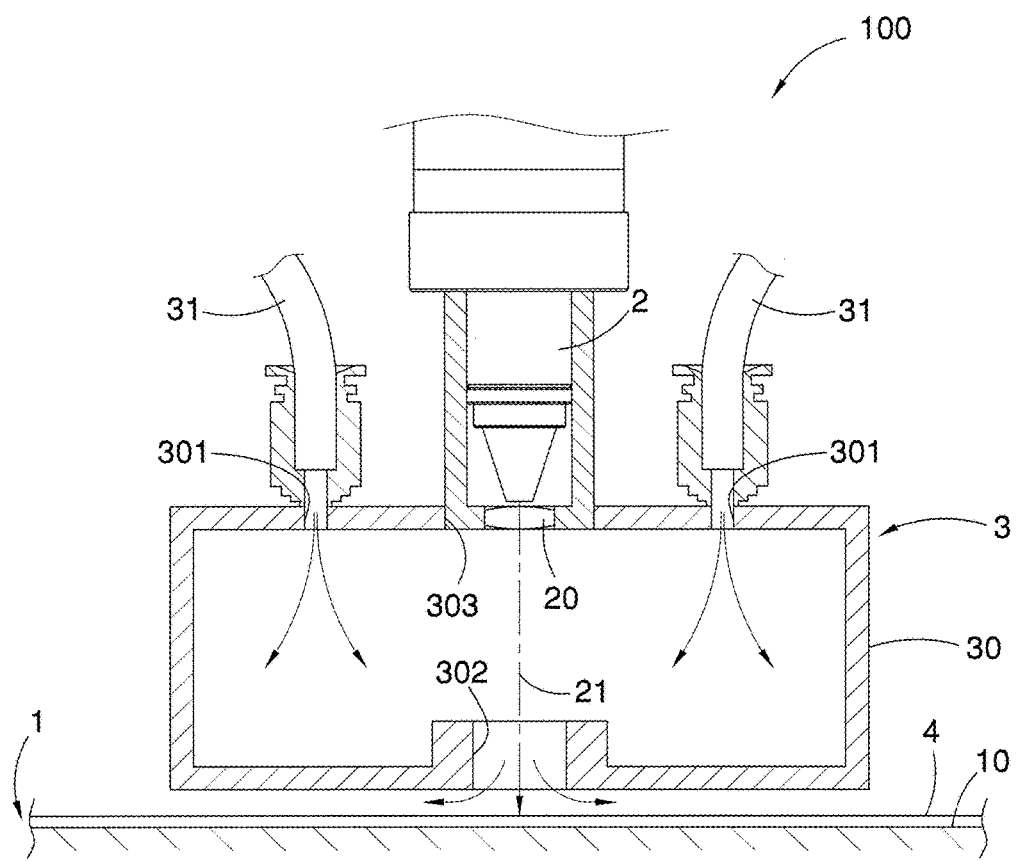
FIG. 3 is a cross-sectional view of the laser direct imaging system shown in FIG. 2.

Referring to FIG. 3, the oxygen-reducing device 3 includes a gas supply system (not shown) and a chamber 30. In this embodiment, the gas supply system supplies nitrogen gas with a high purity greater than 99.5% or an ultra high purity not less than 99.995%. The chamber 30 defines two inlets 301 in a top wall. Each of the inlets 301 is connected to a pipeline 31 of the gas supply system for entrance of the nitrogen gas into the chamber 30. Moreover, the chamber 30 defines an outlet 302 that faces the substrate 4 to allow the nitrogen gas to flow out of the chamber 30 to the surface of the substrate 4 so as to create the low-oxygen environment above the substrate 4.

Referring again to FIG. 3, an opening 303 is defined in the top wall of the chamber 30 and in between the two inlets 301. And, the opening 303 is exactly in line with the outlet 302 below. The laser device 2 has a lens assembly 20 disposed in the opening 303 of the chamber 30. In this manner, the chamber 30 can move with the laser device 2, and a laser beam 21 emitted by the laser device 2 can always pass through the lens assembly 20 into the chamber 30 and leave the chamber 30 via the outlet 302. In other words, the laser beam 21 and the nitrogen gas move together and both leave the chamber 30 via the outlet 302 toward the substrate 4. Accordingly, wherever the laser device 2 move, the oxygen-reducing device 3 will follow to create an instant low-oxygen environment, and therefore any portion of the substrate 4 under the outlet 302 of the chamber 30 will be exposed to the laser beam 21 under the low-oxygen environment, whereby reducing the oxygen inhibition.

An experiment have been conducted to test the performance of the present invention using a liquid photoimageable solder mask that is usually used in a conventional photolithography. In an experimental group, a laser diode with a wavelength of 405 nm is used to expose a substrate coated with the liquid photoimageable solder mask (1) in an air environment, (2) in a first low-oxygen environment created by the high purity nitrogen gas (>99.5%), and (3) in a second low-oxygen environment created by the ultra high purity nitrogen gas (>99.995%), whereas in a control group, a conventional photolithography using a Hg bulb has also been conducted for comparison. The result shows that a first solder mask formed by the conventional photolithography exhibits a gloss of 96.86 gloss units; and, a second solder mask formed by the laser in the air environment exhibits only a gloss of 31.64 gloss units. However, a third solder mask formed by the laser in the first low-oxygen environment (>99.5%) exhibits a gloss of 78.29 gloss unit, and a fourth solder mask formed by the laser in the second low-oxygen environment (>99.995%) exhibits a gloss of 79.29 gloss unit. This shows that the laser direct imaging system of the present invention can actually use the conventional solder mask material to produce a solder mask exhibiting a gloss that is about 80% of the gloss of the conventional solder mask formed by the photolithography using the Hg bulbs. That is, even though the present invention utilizes laser at a single wavelength (405 nm) to expose a substrate coated with a conventional solder material, the gloss of the laser-exposed solder mask can almost be up to the standard of the conventional solder mask and is well enough to be accepted by the consumers.

Figure 4:
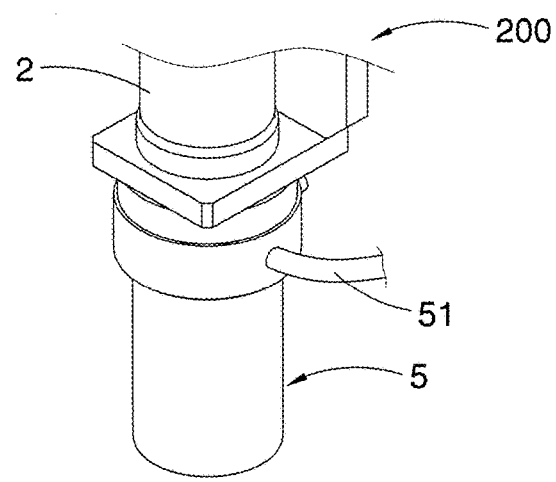
FIG. 4 is a partial perspective view of a laser direct imaging system in accordance with a second embodiment of the present invention.
Figure 5:
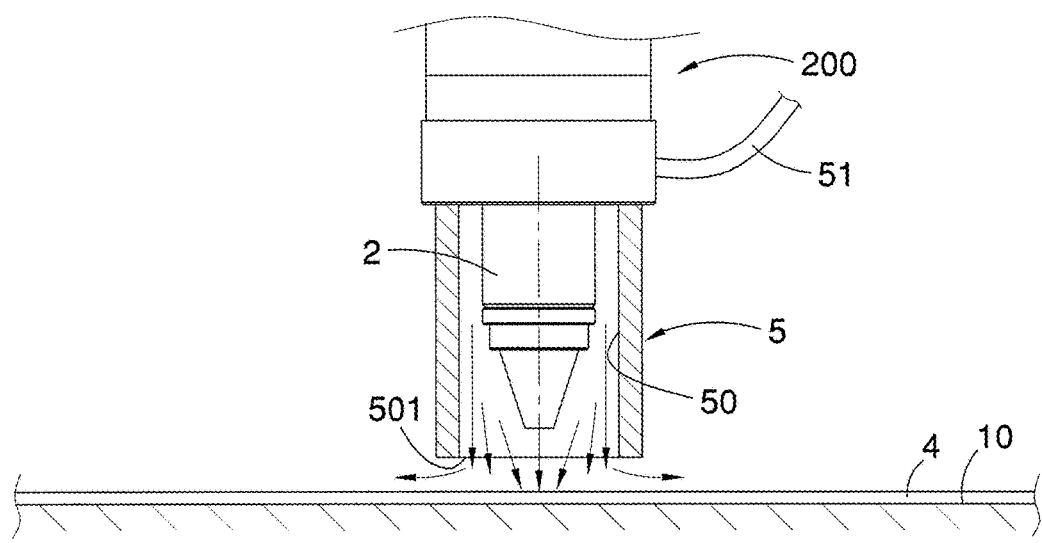
FIG. 5 is a cross-sectional view of the laser direct imaging system shown in FIG. 4.

Referring to FIGS. 4 and 5, there is partially shown a laser direct imaging system 200 according to a second embodiment of this invention. Similar to the system 100 of the first embodiment, the laser direct imaging system 200 includes a laser device 2 and an oxygen-reducing device 5, except that the oxygen-reducing device 5 has a chamber 50 that is somewhat different in shape from the chamber 30 in the first embodiment.

In the second embodiment, the laser device 2 is provided to emit a laser beam 21 at a wavelength in the range of 350 nm to 410 nm for scanning across a surface of a substrate 4. The oxygen-reducing device 5 operates simultaneously with the laser device 2 for outputting an inert gas, such as nitrogen gas, only to a specific area where the laser beam is being aimed such that any portion of the substrate 4, if enters the specific area, will be exposed to the laser beam under a low-oxygen environment.

The oxygen-reducing device 5 includes a gas supply system (not shown) and the chamber 50. The chamber 50 is cylindrical in shape, and defines an inlet (not shown) in a side wall and an outlet 501 in a bottom wall. The inlet of the chamber 50 is connected to a pipeline 51 of the gas supply system, and thereby nitrogen gas can be introduced from the gas supply system into the chamber 50. On the other hand, the outlet 501 of the chamber 50 faces the substrate 4 to allow the nitrogen gas to flow out of the chamber 50 to the surface of the substrate 4 and depletes oxygen to create a low-oxygen (or oxygen free) environment. In particular, the cylindrical chamber 50 and the laser beam of the laser device 2 share a common axis, and therefore the laser beam can come out of the chamber 50 via the outlet 501 to irradiate the substrate 4, ensuring that the substrate 4 is exposed under the low-oxygen environment.

Figure 6:
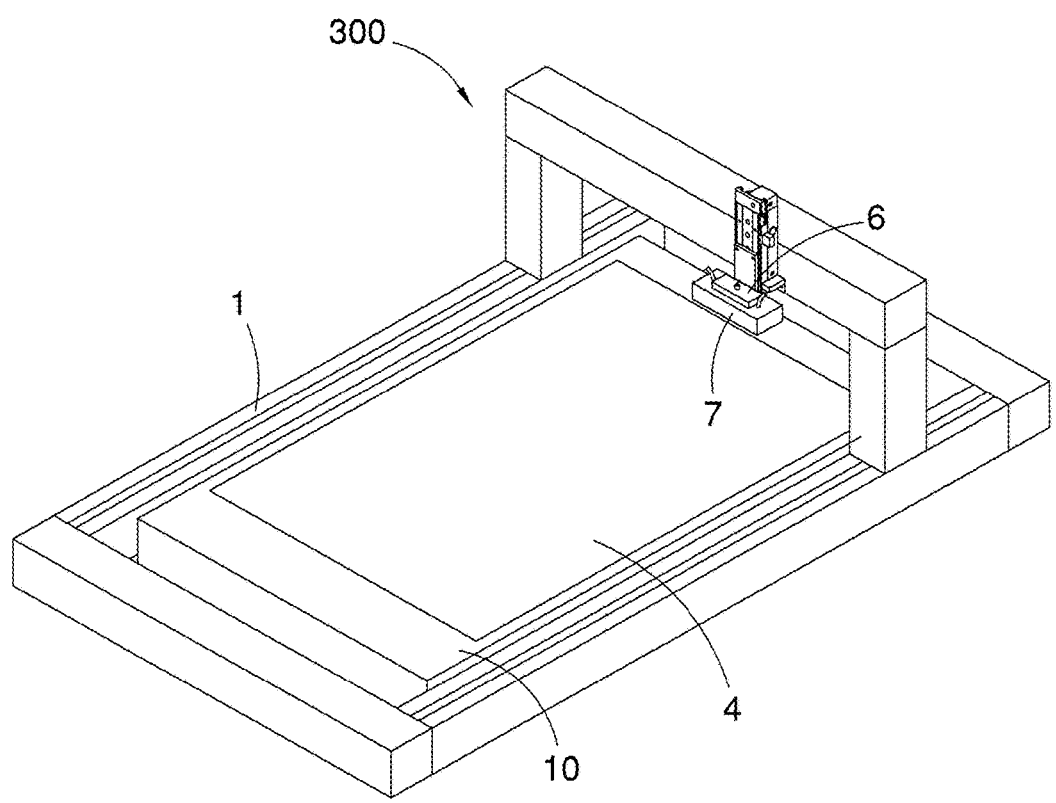
FIG. 6 is a perspective view of a laser direct imaging system in accordance with a third embodiment of the present invention.

Referring to FIG. 6, there is shown a laser direct imaging system 300 according to a third embodiment of this invention. The laser direct imaging system 300 generally includes a machine 1, a linear laser device 6 and an oxygen-reducing device 7. The machine 1 has a stage 10 that is subjected to an atmospheric pressure. A substrate 4 coated with a solder mask material is placed on the stage 10 for laser direct imaging.

Figure 7:
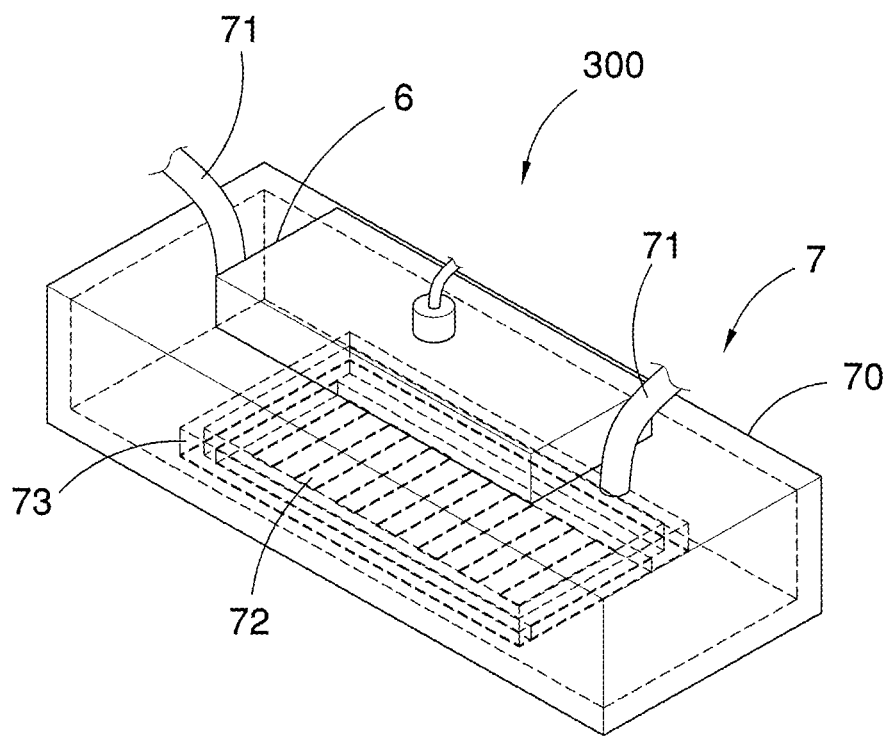
FIG. 7 is a partial enlarged perspective view of the laser direct imaging system shown in FIG. 6, showing a laser device and an oxygen-reducing device.

As shown in FIGS. 6 and 7, the linear laser device 6 is disposed in the machine 1 and configured to produce a linear laser beam at a wavelength in the range of 350 nm to 410 nm for scanning across a surface of the substrate 4 located on the stage 10. The oxygen-reducing device 7 operates simultaneously with the linear laser device 6 for outputting an inert gas, such as nitrogen gas, only to a specific area where the linear laser beam is being aimed such that any portion of the substrate 4, if enters the specific area, will be exposed to the linear laser beam under a low-oxygen environment.

Figure 8:
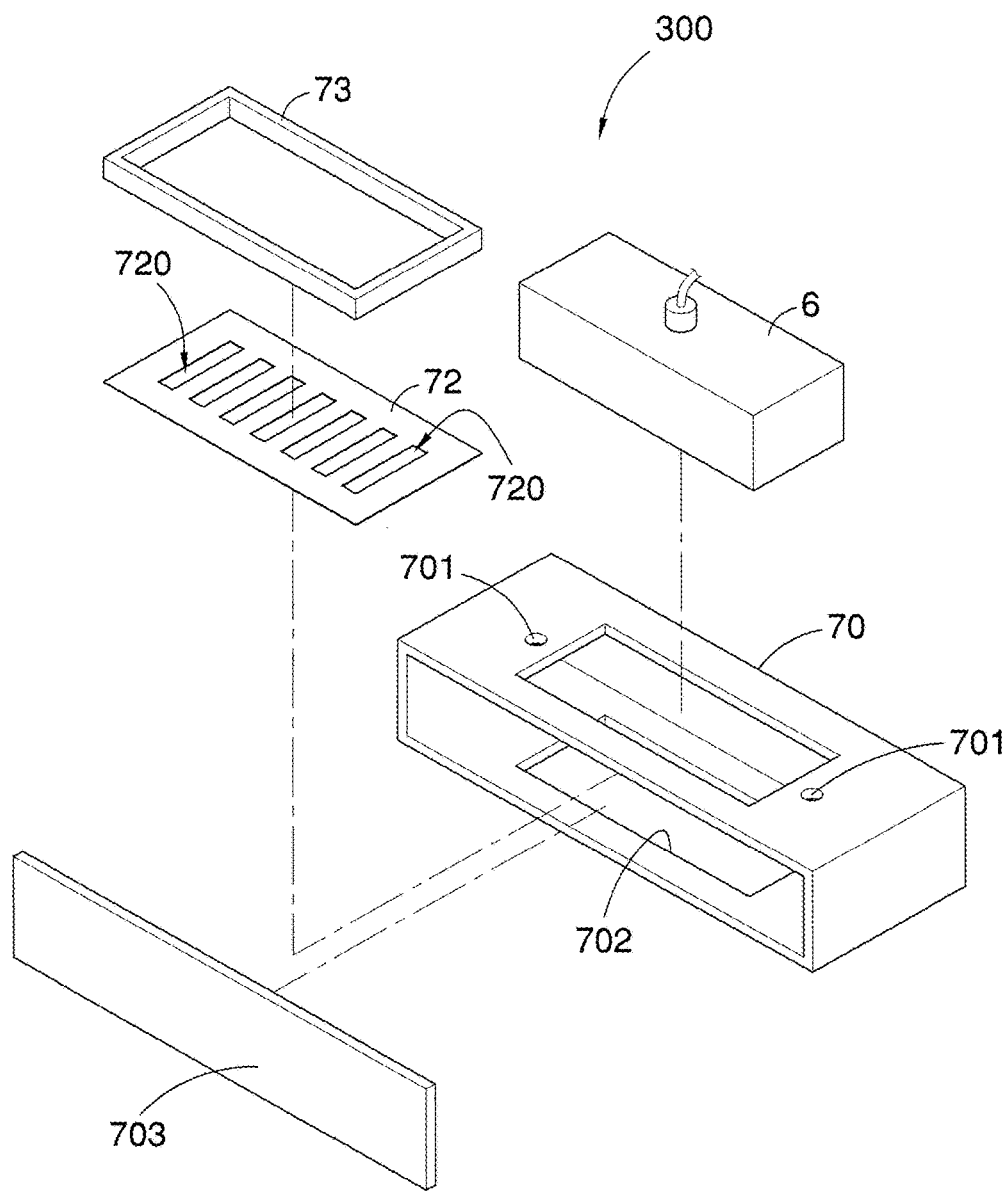
FIG. 8 is an exploded perspective view of the arrangement shown in FIG. 7.

As shown in FIGS. 7 and 8, the oxygen-reducing device 7 includes a gas supply system (not shown), a chamber 70, a flow guiding plate 72 and a frame 73. The gas supply system supplies nitrogen gas with a high purity greater than 99.5% or an ultra high purity not less than 99.995%. The chamber 70 has a detachable side wall 703 for installation of the flow guiding plate 72 and the frame 73 into the chamber 70. In addition, the chamber 70 defines two inlets 701 in a top wall. Each of the inlets 701 of the chamber 70 is connected to a pipeline 71 of the gas supply system for entrance of the nitrogen gas into the chamber 70. Moreover, the chamber 70 defines an outlet 702 facing the substrate 4 to allow the nitrogen gas to flow out of the chamber 70 to the surface of the substrate 4 so as to create the low-oxygen environment above the substrate 4.

Figure 9:
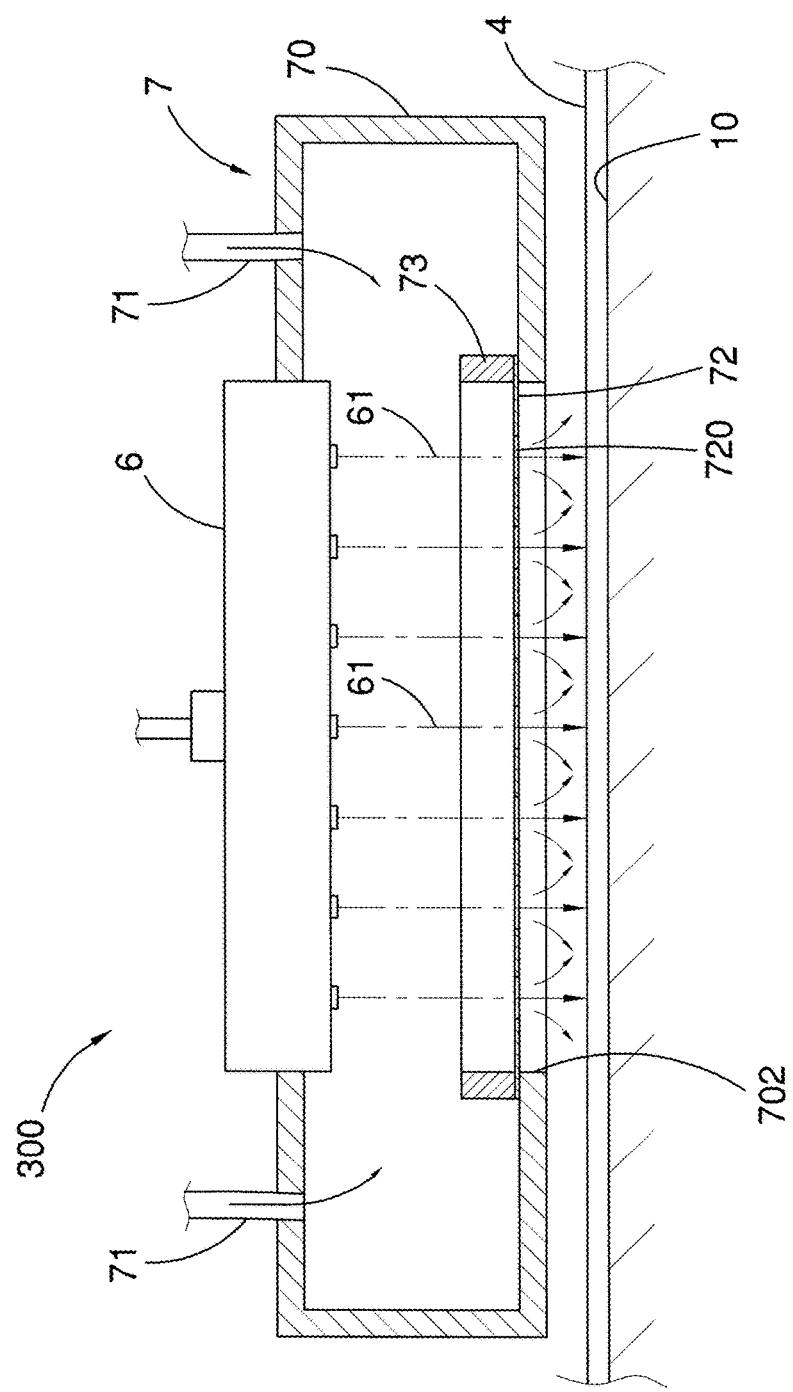
FIG. 9 is an enlarged cross-sectional view of the arrangement shown in FIG. 7.

As shown in FIG. 9, the linear laser device 6 is disposed on top of the chamber 70 and includes a plurality of laser diodes (not shown) each producing a laser beam 61. The laser diodes are arranged in a line so that the laser beams 61 together can be deemed as the linear laser beam. Moreover, the linear laser device 6 is in line with the outlet 702 of the chamber 70. And, wherever the linear laser device 6 moves, the oxygen reducing device 7 will follow to create an instant low-oxygen environment. In this manner, the laser beams 61 produced by the linear laser device 6 can always pass through the outlet 702 of the chamber 70 to scan the substrate 4 under the low-oxygen environment.

More specifically, the flow guiding plate 72 is disposed in the outlet 702 of the chamber 70. The frame 73 is disposed around the outlet 702 of the chamber 70 and presses against edges of the flow guiding plate 72 to secure the flow guiding plate 72 to the bottom wall of the chamber 70. Moreover, the flow guiding plate 72 defines a plurality of holes 720 corresponding to the laser diodes in such a way that the laser beams 61 of the laser diodes can be passed through the respective holes 720 of the flow guiding plate 72 to irradiate the substrate 4 below. And, the nitrogen gas can be distributed evenly over the surface of the substrate 4 to create the low-oxygen environment for the linear laser beam.

Figure 10:
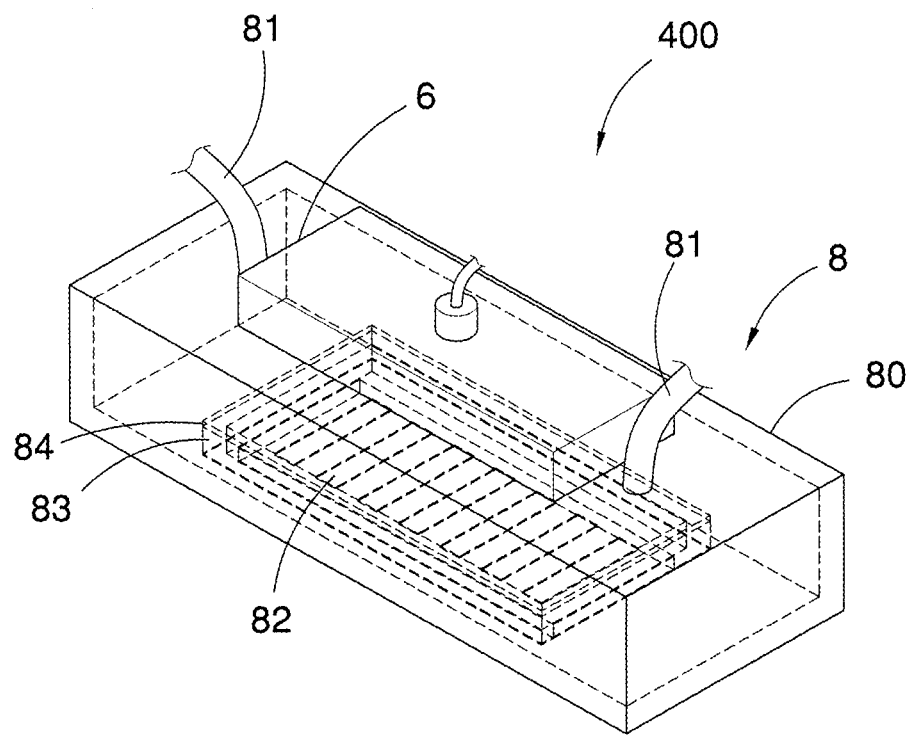
FIG. 10 is a partial perspective view of a laser direct imaging system in accordance with a fourth embodiment of the present invention.
Figure 11:
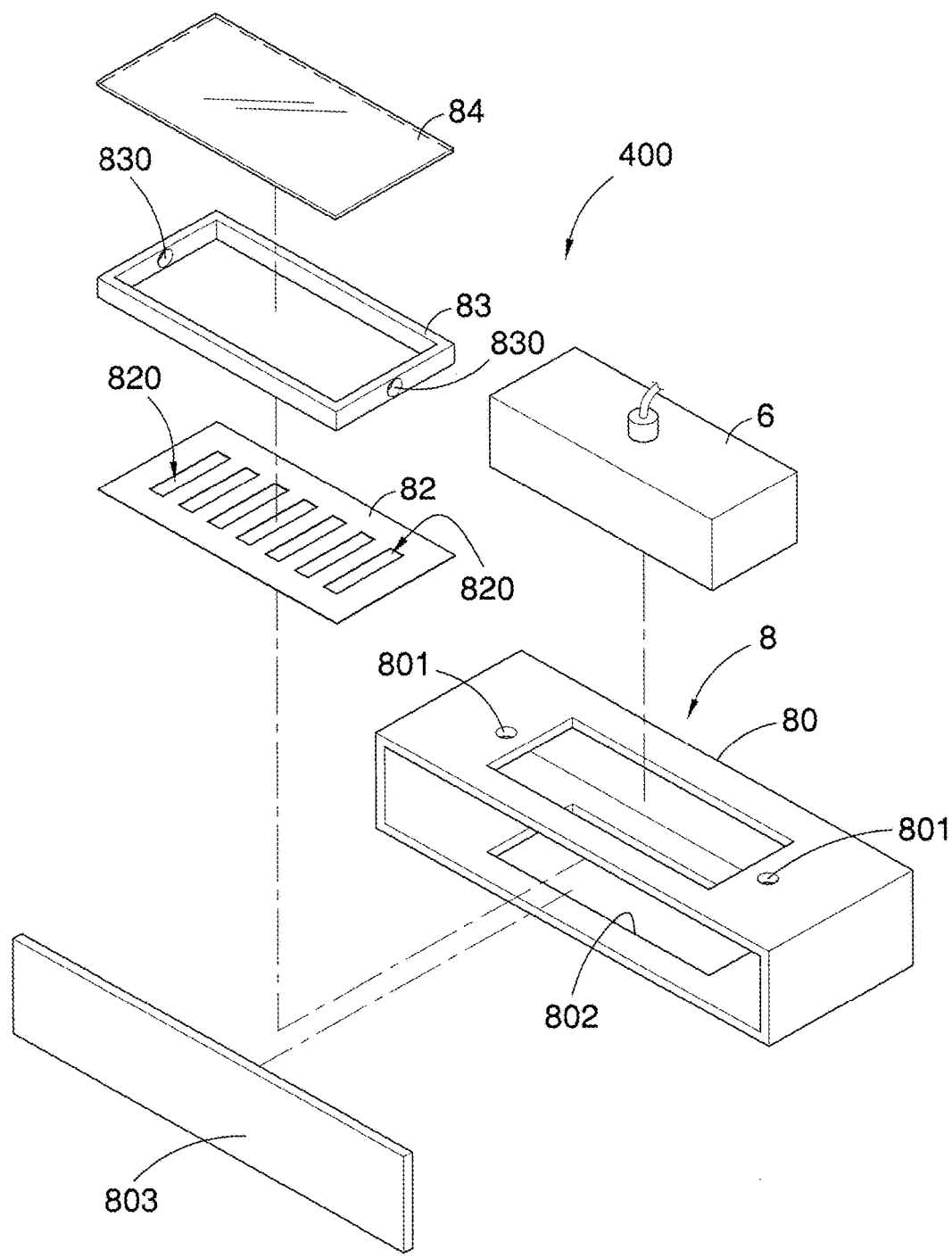
FIG. 11 is an exploded perspective view of the arrangement shown in FIG. 10.
Figure 12:
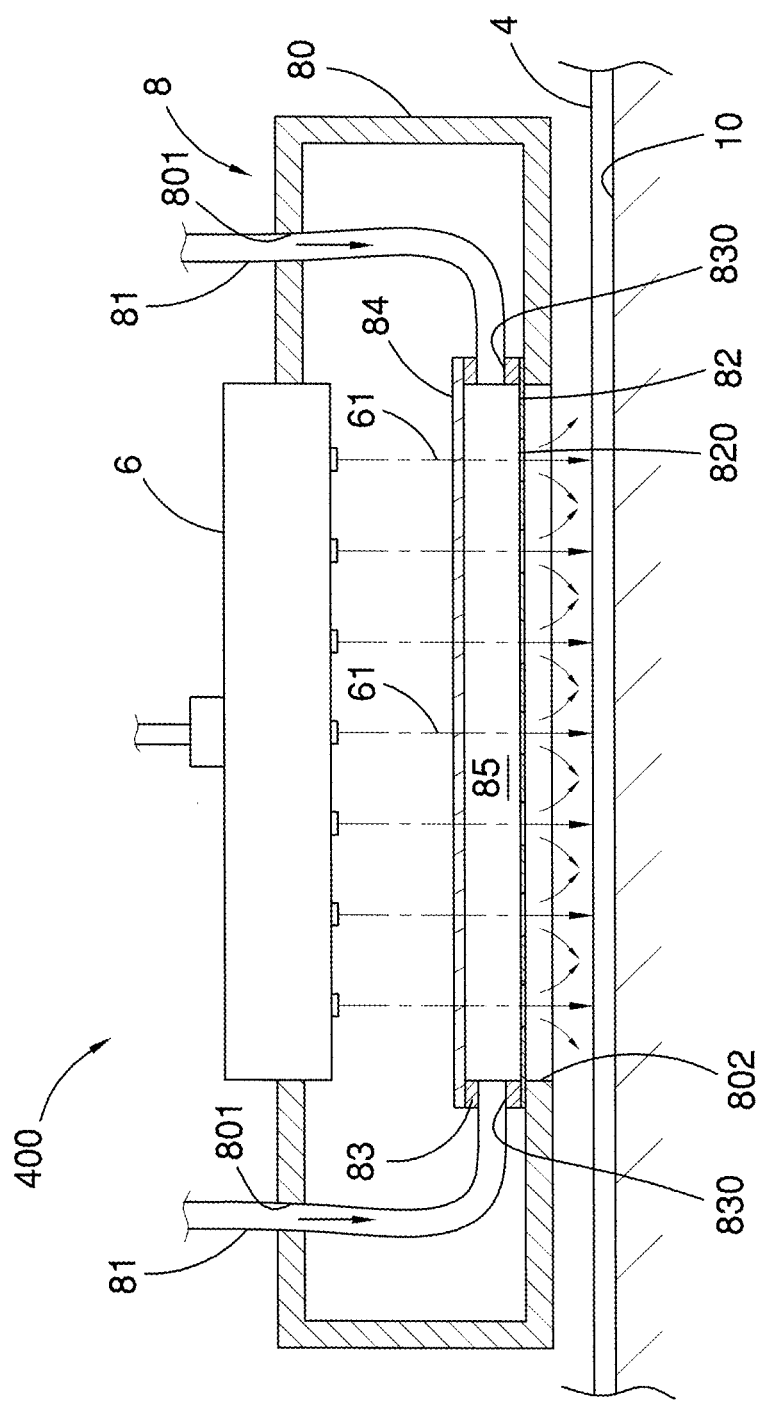
FIG. 12 is an enlarged cross-sectional view of the arrangement shown in FIG. 10.
Figure 13:
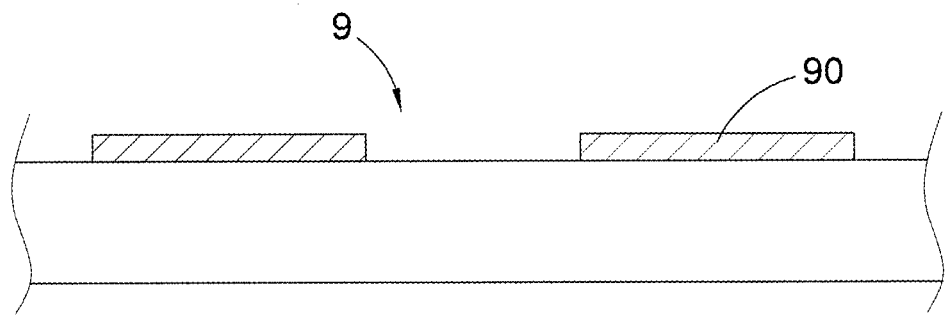
FIGS. 13-15 illustrate a conventional solder mask process.
Figure 14:
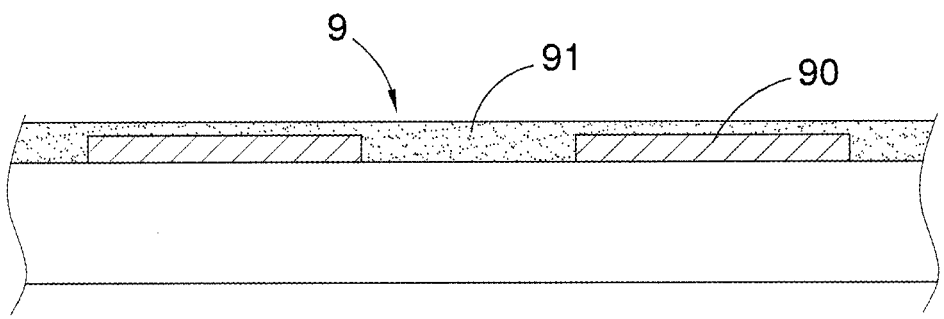
Figure 15:
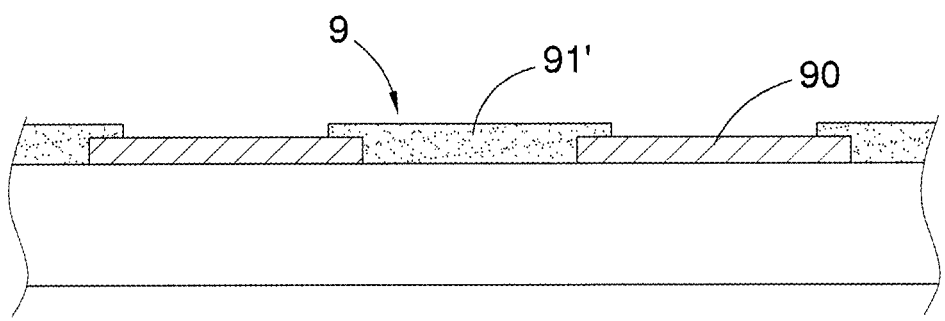

Referring to FIGS. 10 to 12, there is partially shown a laser direct imaging system 400 according to a fourth embodiment of this invention. Similar to the third embodiment 300, the laser direct imaging system 400 includes a linear laser device 6 and an oxygen-reducing device 8, except that the oxygen-reducing device 8 further includes a transparent sheet 84. With this transparent sheet 84 along with other features, the nitrogen gas will be supplied in a different manner as compared to the system in the third embodiment 300.

In this fourth embodiment, the linear laser device 6 is disposed in the machine 1 and configured to produce a linear laser beam at a wavelength in the range of 350 nm to 410 nm for scanning across a surface of the substrate 4 located on the stage 10. The oxygen-reducing device 8 operates simultaneously with the linear laser device 6 for outputting an inert gas, such as nitrogen gas, only to a specific area where the linear laser beam is being aimed such that any portion of the substrate 4, if enters the specific area, will be exposed to the linear laser beam under a low-oxygen environment.

As shown in FIGS. 11 and 12, the oxygen-reducing device 8 includes a gas supply system (not shown), a chamber 80, a flow guiding plate 82 and a frame 83 and the transparent sheet 84. The gas supply system supplies nitrogen gas with a high purity greater than 99.5% or an ultra high purity not less than 99.995%. The chamber 80 has a detachable side wall 803 for installation of the flow guiding plate 82, the frame 83 and the transparent sheet 84 into the chamber 80. In addition, the chamber 80 defines two inlets 801 in a top wall. Each of the inlets 801 of the chamber 80 is connected to the pipeline 81 of the gas supply system for entrance of the nitrogen gas into the chamber 80. Moreover, the chamber 80 defines an outlet 802 facing the substrate 4 to allow the nitrogen gas to flow out of the chamber 80 to the surface of the substrate 4 to create the low-oxygen environment above the substrate 4.

As shown in FIG. 12, the linear laser device 6 is disposed on top of the chamber 80 and includes a plurality of laser diodes (not shown) each producing a laser beam 61. The laser diodes are arranged in a line so that the laser beams 61 together can be deemed as the linear laser beam. Moreover, the linear laser device 6 is in line with the outlet 802 of the chamber 80. Wherever the linear laser device 6 moves, the chamber 80 will follow to create an instant low-oxygen environment. In this manner, the laser beams 61 can always pass through the outlet 802 of the chamber 80 to scan the substrate 4 under the low-oxygen environment.

Specifically, the flow guiding plate 82 is disposed in the outlet 802 of the chamber 80. The frame 83 is disposed around the outlet 802 of the chamber 80 and presses against edges of the flow guiding plate 82 to secure the flow guiding plate 82 to the bottom wall of the chamber 80. Moreover, the flow guiding plate 82 defines a plurality of holes 820 corresponding to the laser diodes in such a way that the laser beams 61 can be passed through the respective holes 820 of the flow guiding plate 82 to irradiate the substrate 4. The transparent sheet 84 is disposed on top of the frame 83. In addition, the transparent sheet 84, the frame 83 and the flow guiding plate 82 together define an inner room 85 within the chamber 80. And, the laser beams 61 generated by the laser diodes can pass through the transparent sheet 84 into the inner room 85 and exit via the holes 820 in the flow guiding plate 82 to irradiate the substrate 4.

More specifically, the frame 83 defines a pair of apertures 830 therein. The pipelines 81 of the gas supply system pass through the inlets 801 of the chamber 80 as well as the apertures 830 of the frame 83 to introduce the nitrogen gas into the inner room 85. The nitrogen gas will then be distributed evenly by the flow guiding plate 82 to the surface of the substrate 4 to create the low-oxygen environment above the substrate 4.

In other aspect, there is provided a laser direct imaging method in the present for making a solder mask using the aforementioned laser direct imaging system. The method generally includes the following steps: Firstly, a substrate 4 is placed on a stage under an atmospheric-pressure condition, wherein the substrate 4 is coated with a liquid photoimageable solder mask. Secondly, the substrate 4 is scanned with a laser device 2 at a wavelength in a range of 350 nm to 410 nm; and while the substrate 4 is being scanned, continuously introducing an inert gas, such as nitrogen gas, only to a specific area where a laser beam of the laser device 2 is being aimed such that any portion of the substrate 4, if enters the specific area, can be exposed to the laser beam under a low-oxygen environment.

It should be evident that this disclosure is by way of example and that various changes may be made by adding, modifying or eliminating details without departing from the fair scope of the teaching contained in this disclosure.

What is claimed is:

1. A laser direct imaging system, comprising:
   a stage being subjected to an atmospheric environment;
   a laser device configured to provide at least one laser beam to a surface of a solder mask-coated substrate located on the stage; and
   an oxygen-reducing device, which during operation of the laser device continuously outputs an inert gas to a specific area of the surface of the solder mask-coated substrate where the laser beam is being aimed, and a peripheral area around the specific area such that the laser beam generated by the laser device is surrounded by the outputted inert gas, thereby separating the specific area of the surface of the solder mask-coated substrate from the atmospheric environment;
   wherein the oxygen-reducing device includes a gas supply system for supplying the inert gas; and a chamber having an inlet connected to the gas supply system for entrance of the inert gas into the chamber, and an outlet facing the solder mask-coated substrate to allow the inert gas to flow across the surface of the solder mask-coated substrate;
   wherein the laser beam generated by the laser device passes through the outlet of the chamber to the surface of the solder mask-coated, and the laser beam passing out of the outlet of the chamber is surrounded by the inert gas; and
   wherein the laser device comprises a plurality of laser diodes arranged in a line to produce two or more laser beams; and the oxygen-reducing device further includes a flow guiding plate disposed in the outlet of the chamber, wherein the flow guiding plate defines a plurality of holes corresponding to the laser diodes in such a way that the laser beam emitted by each of the laser diodes is passed through the respective hole of the flow guiding plate to the solder mask-coated substrate.

2. A laser direct imaging system as recited in claim 1, wherein the oxygen-reducing device further includes a frame pressing against edges of the flow guiding plate to secure the flow guiding plate.

3. A laser direct imaging system, comprising:
   a stage being subjected to an atmospheric environment;
   a laser device configured to provide at least one laser beam to a surface of a solder mask-coated substrate located on the stage; and
   an oxygen-reducing device, which during operation of the laser device continuously outputs an inert gas to a specific area of the surface of the solder mask-coated substrate where the laser beam is being aimed, and a peripheral area around the specific area such that the laser beam generated by the laser device is surrounded by the outputted inert gas, thereby separating the specific area of the surface of the solder mask-coated substrate from the atmospheric environment;
   wherein the laser device comprises a plurality of laser diodes arranged in a line to produce two or more laser beams; and the oxygen-reducing device further includes:
   a gas supply system having a pipeline to transport the inert gas;
   a chamber having an inlet and an outlet, wherein the outlet is defined in a bottom of the chamber and faces the surface of the solder mask-coated substrate, and the laser device is located on top of the chamber ;

a frame disposed around the outlet of the chamber and defining an aperture therein;

a flow guiding plate disposed in the outlet of the chamber and defining a plurality of holes corresponding to the laser diodes in such a way that a laser beam emitted by each of the laser diodes is passed through the respective hole of the flow guiding plate to the solder-mask coated substrate; and a transparent sheet disposed on top of the frame, wherein the transparent sheet, the frame and the flow guiding plate together define an inner room within the chamber, and the laser beams generated by the laser diodes are passed through the transparent sheet into the inner room and exit via the holes of the flow guiding plate to the solder-mask coated substrate; and wherein the pipeline of the gas supply system passes through the inlet of the chamber and the aperture of the frame to introduce the inert gas into the inner room.

4. A laser direct imaging system, comprising:

a stage for placement of a substrate;

a gas supply system for supplying an inert gas with a pipeline thereof;

a chamber facing the stage and having at least one inlet connected to the gas supply system for introduce of the inert gas into the chamber, and an outlet facing toward the stage for guiding the inert gas to a surface of the substrate;

a flow guiding plate disposed in the outlet of the chamber and having a plurality of holes to divide the inert gas into branches before arriving at the surface of the substrate; and a laser device including a plurality of laser diodes arranged in a line, the laser diodes located corresponding to the respective holes of the flow guiding plate such that the laser beams generated by the laser diodes pass through the respective hole of the flow guiding plate to arrive at the surface of the substrate.

5. A laser direct imaging system as recited in claim 4, wherein the oxygen-reducing device further includes a frame pressing against edges of the flow guiding plate to secure the flow guiding plate.

6. A laser direct imaging system, comprising:

a stage for placement of a substrate;

a gas supply system for supplying an inert gas;

a chamber facing the stage and having at least one inlet connected to the gas supply system for introduce of the inert gas into the chamber, and an outlet facing toward the stage for guiding the inert gas to a surface of the substrate;

a frame disposed around the outlet of the chamber and defining an aperture therein;

a flow guiding plate disposed in the outlet of the chamber and having a plurality of holes to divide the inert gas into branches before arriving at the surface of the substrate;

a transparent sheet disposed on top of the frame; and a laser device including a plurality of laser diodes arranged in a line, the laser diodes located corresponding to the respective holes of the flow guiding plate such that the laser beams generated by the laser diodes pass through the respective hole of the flow guiding plate to arrive at the surface of the substrate, wherein the transparent sheet, the frame and the flow guiding plate together define an inner room within the chamber, and the laser beams generated by the laser diodes are passed through the transparent sheet into the inner room and exit via the holes of the flow guiding plate to the substrate; and wherein the pipeline of the gas supply system passes through the inlet of the chamber and the aperture of the frame to introduce the inert gas into the inner room.

\* \* \* \* \*